United States Patent [19]

Gillery

[11] Patent Number: 4,512,864

[45] Date of Patent: Apr. 23, 1985

[54] LOW RESISTANCE INDIUM OXIDE FILMS

[75] Inventor: F. Howard Gillery, Allison Park, Pa.

[73] Assignee: PPG Industries, Inc., Pittsburgh, Pa.

[21] Appl. No.: 556,657

[22] Filed: Nov. 30, 1983

[51] Int. Cl.³ ............................................. C23C 15/00
[52] U.S. Cl. ............................ 204/192 P; 204/192 R; 204/192 C; 204/192 SP; 428/630
[58] Field of Search ............ 204/192 R, 192 C, 192 P

[56] References Cited

U.S. PATENT DOCUMENTS

| 3,907,660 | 9/1975 | Gillery | 204/298 |
| 4,094,763 | 6/1978 | Gillery et al. | 204/192 |
| 4,166,018 | 8/1979 | Chapin | 204/192 |
| 4,201,649 | 5/1980 | Gillery | 204/192 R |

Primary Examiner—Arthur P. Demers
Attorney, Agent, or Firm—Donna L. Seidel

[57] ABSTRACT

A method for depositing an indium oxide film by magnetron sputtering is disclosed wherein the resistance of the film is lowered by maintaining the substrate at an elevated temperature during the magnetron sputtering process.

9 Claims, No Drawings

LOW RESISTANCE INDIUM OXIDE FILMS

BACKGROUND OF THE INVENTION

The present invention relates generally to the art of coating substrates by cathode sputtering, and more particularly to the art of depositing indium oxide films by magnetically enhanced cathode sputtering.

U.S. Pat. No. 3,907,660, to Gillery and U.S. Pat. No. 4,094,763 to Gillery et al disclose an apparatus and method for coating transparent refractory substrates with electroconductive films by cathode sputtering of metals such as tin and indium in a low pressure atmosphere containing a controlled amount of oxygen at a controlled substrate temperature within a range of 400° F. to a temperature at which the substrate is detrimentally affected, usually at or above 600° F.

U.S. Pat. No. 4,166,018 to Chapin discloses a sputtering apparatus in which a magnetic field is formed adjacent a planar sputtering surface, the field comprising arching lines of flux over a closed loop erosion region on the sputtering surface.

SUMMARY OF THE INVENTION

The present invention provides a method for lowering the resistance of indium oxide films deposited by magnetron sputtering. In accordance with the present invention, the resistance of indium oxide films deposited by magnetron sputtering is lowered by raising the temperature of the substrate during magnetron sputtering.

DETAILED DESCRIPTION OF THE PREFERRED EMBODIMENT

Low resistance indium oxide films are obtained at relatively rapid deposition rates by combining magnetron sputtering techniques with high substrate temperatures in accordance with the present invention.

Known D.C. diode sputtering techniques using an alloy cathode of 90% indium and 10% tin have produced indium oxide coatings with resistances of 5 ohms per square at a film thickness exhibiting fourth order red interference effects, typically about 6500 Angstroms. These cathode sputtering techniques generate a great deal of heat, and substrate temperatures are generally between 400° F. (about 204° C.) and the melting point of the substrate. Various cooling techniques may be employed for the cathode and/or the substrate. Unfortunately, these cathode sputtering processes are very time consuming, and depositing films of the necessary thickness to obtain such low resistance is not economical in practice.

Current magnetron sputtering techniques are much faster and more efficient, and do not add appreciable heat to the substrate being coated, so that cooling techniques are not required and substrates with lower melting points may be coated. Using an alloy cathode of 90 percent indium and 10 percent tin, magnetron sputtering on glass at ambient temperature produces an indium oxide film with a resistance of about 15 ohms per square at a thickness exhibiting fourth order red interference effects.

In accordance with the present invention, the resistance of indium oxide films produced by magnetron sputtering is lowered by coating substrates at higher substrate temperatures. For example, at a substrate temperature of 200° F. (about 93° C.), an indium oxide film is deposited with a resistance of about 10 ohms per square at a thickness exhibiting fourth order red interference effects. At 400° F. (about 204° C.), an indium oxide film is deposited with a resistance of about 5 ohms per square at a thickness exhibiting fourth order red interference effects. Substrate temperatures higher than about 400° F. (about 204° C.) do not result in lower resistances, but do provide the additional advantage that the magnetron sputtering process is easier to control because the sputtering gas composition becomes less critical.

The present invention will be further understood from the descriptions of specific examples which follow.

EXAMPLE I

A clear float glass sheet 2 feet square by ⅛ inch thick (about 61 centimeters square by 3 millimeters) having an initial luminous transmittance of about 90 percent is coated by magnetron sputtering. A cathode comprising 90 percent indium and 10 percent tin is sputtered at 350 volts and 15 amps. The coating chamber, to which argon and oxygen are supplied at flow rates of 500 and 350 cubic centimeters per minute respectively, is maintained at a pressure of $6 \times 10^{-4}$ Torr. The glass, at a temperature of 600° F. (about 315° C.), is coated by a single pass of the scanning cathode travelling at 120 inches (about 3 meters) per minute. A colorless film is formed which results in a final luminous transmittance of 86 percent. The indium oxide containing coating has a resistance of about 100 ohms per square, compared with 237 ohms per square for a film of the same thickness deposited at ambient temperature.

EXAMPLE II

A clear glass sheet measuring 30 by 27 × ⅛ inch (about 76 by 69 by 0.3 centimeters) is coated as above with the cathode operating at 340 volts and 15 amps, the chamber at a pressure of $8 \times 10^{-4}$ Torr and the gas flow rates at 650 cc/minute argon and 250 cc/minute oxygen. With the glass temperature at 450° F. (about 232° C.), and the cathode scanning at 8 inches (about 20 centimeters) per second, an indium oxide containing film is deposited, resulting in a luminous transmittance of about 84 percent. The film is about 1400 Angstroms thick, exhibiting first order red interference effects, and having a resistance of about 18 ohms per square, compared with about 40 ohms per square for a film of the same thickness deposited at ambient temperature.

EXAMPLE III

A clear glass sheet is coated as in Example II except that the cathode scanning speed is only 4 inches (about 10 centimeters) per second. An indium oxide containing film is deposited, resulting in a luminous transmittance of about 83 percent. The film has a thickness of about 2800 Angstroms, exhibiting second order red interference effects, and has a resistance of about 13 ohms per square, compared with about 25 ohms per square for a film of the same thickness deposited at ambient temperature.

EXAMPLE IV

A clear glass sheet measuring 31 by 16 by ⅛ inch (about 79 by 41 by 0.3 centimeters) is coated as in the previous examples with the cathode operating at 340 volts, 5 amps, at a scaning speed of 120 inches (about 3 meters) per minute. The coating chamber is maintained at $6.8 \times 10^{-4}$ Torr with argon and oxygen flow rates at 660 and 260 cubic centimeters per minute respectively. With the glass temperature at 355° F.(about 179° C.), an indium oxide containing coating is deposited, resulting in a luminous transmittance of about 81 percent. The indium oxide containing film is about 5600 Angstroms thick, exhibiting fourth order red interference effects, and has a resistance of about 5 ohms per square, compared with a resistance of 10 to 20 ohms per square for a film of the same thickness deposited at ambient temperature.

The above examples are offered to illustrate the present invention, the scope of which is defined by the following claims. Various modifications of temperature and process parameters are included, as well as the use of substrates other than glass, such as plastics, and other cathode compositions, particularly tin. Heating of the substrate may be accomplished by any means, such as conductive, convective, or radiant heating, particularly the radiant heating means disclosed in U.S. Pat. No. 3,907,660 to Gillery, the disclosure of which is incorporated herein by reference, and now U.S. Pat. No. 4,446,875, by F. H. Gillery, the disclosure of which is incorporated herein by reference.

I claim:

1. In a method for sputtering a metal oxide containing film onto a substrate surface from a cathode comprising a metal selected from the group consisting of indium, tin and mixtures thereof, in which a magnetic field is formed adjacent the cathode sputtering surface, the improvement which comprises maintaining the substrate at a temperature sufficiently higher than the ambient temperature during sputtering to produce a metal oxide containing film with a resistance significantly lower than that of a film similarly deposited on a substrate at ambient temperature.

2. The improved method according to claim 1, wherein the substrate is maintained at a temperature of at least about 90° C.

3. The improved method according to claim 2, wherein the substrate is maintained at a temperature of at least about 200° C.

4. The improved method according to claim 3, wherein the substrate is glass.

5. The improved method according to claim 4, wherein the cathode is an alloy comprising about 90 percent indium and 10 percent tin.

6. The improved method according to claim 5, wherein the film is formed to a thickness of about 300 Angstroms and has a resistance of about 100 ohms per square.

7. The improved method according to claim 5, wherein the film is formed to a thickness exhibiting first order red interference effects and has a resistance less than about 20 ohms per square.

8. The improved method according to claim 5, wherein the film is formed to a thickness exhibiting fourth order red interference effects and has a resistance less than about 10 ohms per square.

9. The improved method according to claim 8, wherein the film has a resistance of about 5 ohms per square.

* * * * *